US012577484B2

(12) United States Patent
Doshi et al.

(10) Patent No.: US 12,577,484 B2
(45) **Date of Patent: *Mar. 17, 2026**

(54) COMPOSITIONS AND METHODS FOR MARKING HYDROCARBON COMPOSITIONS WITH NON-MUTAGENIC DYES

(71) Applicant: United Color Manufacturing, Inc., Newton, PA (US)

(72) Inventors: Haresh Doshi, Hillsborough, NJ (US); Michael Friswell, Wayne, NJ (US); Thomas E. Nowakowski, New Hope, PA (US)

(73) Assignee: United Color Manufacturing, Inc., Newtown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/335,610

(22) Filed: Jun. 15, 2023

(65) Prior Publication Data

US 2023/0326968 A1 Oct. 12, 2023

Related U.S. Application Data

(63) Continuation of application No. 17/009,258, filed on Sep. 1, 2020, now Pat. No. 11,702,606, which is a continuation of application No. 15/650,021, filed on Jul. 14, 2017, now Pat. No. 10,774,280.

(60) Provisional application No. 62/362,975, filed on Jul. 15, 2016.

(51) Int. Cl.

| | |
|---|---|
| ***C10L 1/00*** | (2006.01) |
| ***C09B 31/068*** | (2006.01) |
| ***C09B 67/40*** | (2006.01) |
| ***C10L 1/226*** | (2006.01) |
| ***C10M 133/28*** | (2006.01) |
| ***C10M 171/00*** | (2006.01) |
| ***H01L 21/265*** | (2006.01) |
| ***H01L 21/28*** | (2006.01) |
| ***H10D 12/00*** | (2025.01) |
| ***H10D 18/65*** | (2025.01) |
| ***H10D 30/66*** | (2025.01) |
| ***H10D 62/10*** | (2025.01) |
| ***H10D 64/27*** | (2025.01) |
| ***H10D 84/40*** | (2025.01) |
| *C10N 40/00* | (2006.01) |

(52) U.S. Cl.

CPC ............ *C10L 1/226* (2013.01); *C09B 31/068* (2013.01); *C09B 67/0082* (2013.01); *C10L 1/003* (2013.01); *C10M 133/28* (2013.01); *C10M 171/007* (2013.01); *H01L 21/26513* (2013.01); *H01L 21/26586* (2013.01); *H01L 21/28017* (2013.01); *H10D 12/481* (2025.01); *H10D 18/655* (2025.01); *H10D 30/668* (2025.01); *H10D 62/127* (2025.01); *H10D 64/513* (2025.01); *H10D 84/406* (2025.01); *C10L 2230/16* (2013.01); *C10N 2040/42* (2020.05)

(58) Field of Classification Search

CPC ..... C10L 1/003; C10L 1/226; C10M 171/007; C10M 133/28; C09B 31/068

See application file for complete search history.

(56) References Cited

U.S. PATENT DOCUMENTS

| | | | | |
|---|---|---|---|---|
| 921,546 | A | 5/1909 | Julius | |
| 1,947,029 | A | 2/1934 | Allison | |
| 2,016,495 | A | 10/1935 | Heyna | |
| 2,090,938 | A | 8/1937 | Conrad | |
| 2,538,431 | A | 1/1951 | Shulman | |
| 3,690,809 | A * | 9/1972 | Orelup | C09B 67/008 8/521 |
| 3,704,106 | A | 11/1972 | Orelup | |
| 3,793,305 | A | 2/1974 | Balon | |
| 4,000,985 | A | 1/1977 | Orelup | |
| 4,191,048 | A | 3/1980 | Molina | |
| 4,210,414 | A | 7/1980 | Hansen et al. | |
| 4,315,756 | A | 2/1982 | Zeidler | |
| 4,473,376 | A * | 9/1984 | Hansen | C09B 29/103 208/12 |
| 5,676,708 | A * | 10/1997 | Smith | C09B 31/068 44/328 |
| 6,339,145 | B1 | 1/2002 | Traverso | |
| 6,514,917 | B1 | 2/2003 | Smith et al. | |
| 6,616,712 | B1 * | 9/2003 | Beck | C09B 67/0055 8/466 |
| 2007/0266895 | A1 | 11/2007 | Smith | |

FOREIGN PATENT DOCUMENTS

WO 2003022942 A1 3/2003

OTHER PUBLICATIONS

International Search report dated Oct. 30, 2017 for application PCT/US2017/042096 (Year: 2017).*

* cited by examiner

*Primary Examiner* — Ellen M Mcavoy
*Assistant Examiner* — Ming Cheung Po
(74) *Attorney, Agent, or Firm* — Coulby IP, LLC

(57) ABSTRACT

The disclosure provides dyes for marking hydrocarbon compositions. More particularly, the disclosure relates to non-mutagenic dyes for marking hydrocarbon compositions.

14 Claims, No Drawings

COMPOSITIONS AND METHODS FOR MARKING HYDROCARBON COMPOSITIONS WITH NON-MUTAGENIC DYES

CROSS-REFERENCE TO RELATED APPLICATIONS

This application is a continuation of U.S. application Ser. No. 17/009,258, filed on Sep. 1, 2020, which application is a continuation of U.S. application Ser. No. 15/650,021, filed on Jul. 14, 2017, which is now U.S. Pat. No. 10,774,280, granted on Sep. 15, 2020, which application claims the benefit of and incorporates herein by reference for all purposes U.S. Provisional Patent Application Ser. No. 62/362,975 filed on Jul. 15, 2016 and entitled "Compositions and Methods for Marking Liquid Hydrocarbon Compositions With Non-Mutagenic Dyes".

STATEMENT REGARDING FEDERALLY SPONSORED RESEARCH

Not Applicable

BACKGROUND OF THE INVENTION

The field of the invention are dyes for marking hydrocarbon compositions. More particularly, the invention relates to non-mutagenic dyes for marking hydrocarbon compositions. Dyes have often been used to color petroleum products such as diesel fuel, gasoline, lubricating oils, grease, automatic transmission fluids and plastic products. Red is a particularly important petroleum dye color used in a variety of applications. Internal Revenue Service regulations, for instance, require the use of red dye to identify off-road diesel fuels. There is concern, however, that some red dyes presently used in the industry, particularly amino-azo benzene derived red dyes, pose potential health risks because they may be mutagenic or carcinogenic. Moreover, the manufacture of these materials requires handling mutagenic, carcinogenic materials and intermediates. Handling these dyes or products containing the dyes, may involve some level of health risk because of the possible mutagenic character of the dye.

Red azo dyes for coloring petroleum products have been commercially available for many years. For example, U.S. Pat. Nos. 3,690,809 and 3,704,106 describe liquid dyes, some of which have been useful for coloring petroleum products, and, in some instances, plastics. Although these dyes may be effective colorants, the raw materials and intermediate products used in their production may present health risks if not handled properly. Some of the more widely used compounds, such as red C. I. Solvent Reds 24 and 164, are derived wholly or in part from 2-methylaniline, which is a suspected human carcinogen. In particular, to produce the foregoing red dyes, 2-methylaniline is converted, in whole or in part, to 1-amino 2,2' dimethyl-4-azobenzene, which is also known to be a carcinogen. The azobenzene compound, which is sometimes isolated, is then converted to a diazonium compound that is azo coupled to 2 naphthalenol, or an alkyl derivative thereof, to produce the red dye. The red dye is typically sold as a liquid concentrate, but may also be prepared and used as an unsolvated solid. In addition to potential health concerns associated with the final dye products and the precursor these conventional red azo dyes are somewhat unstable in that they can be degraded under conditions of excessive heat or by contact with a protogenic acid or chemical reducing agent. During degradation, for instance, Solvent Reds 24 and 164 produce 1-amino-2,2'-dimethyl-4-azobenzene and/or its homologues, which are also suspected to have carcinogenic activity.

U.S. Pat. No. 5,676,708 ("the '708 Patent") discloses diaazo dyes having a highly unpredictable level of mutagenicity. For example, 2,2'-dimethylaminoazobenzene derivatives produced in Example 1 exhibited strong mutagenic response under the "Ames Test". On the other hand, a 2,2'-diethylaminoazobenzene derivative produced in Example 2 and a 2-2'-di(1-methylethyl)aminoazobenzene derivative produced in Example 6 using the same process used in Example 1 showed no positive mutagenic response using the same Ames Test. To put this in perspective, simply changing two $R_2$ groups from methyl to ethyl or isopropyl completely eliminated strong mutagenicity in the dyes of the '708 Patent.

The azo dyes from the '708 Patent are configured in an "ortho-ortho" configuration (i.e., the $R_1$ groups for Formula I of the '708 Patent are in ortho positions). Generally speaking, it is expected that diazo dyes having a "meta-meta" configuration (i.e., if the R groups for Formula I of the '708 Patent were in meta positions) would be mutagenic like their ortho-ortho counterparts and/or have lower color values than their ortho-ortho counterparts. In other words, meta-meta diazo dyes are considered inferior to their ortho-ortho counterparts. As such, relatively little attention has been paid to their development. Despite the ortho-ortho diazo dyes of the '708 Patent being described in an issued patent in 1997, the inventors of the present disclosure are not aware of any pursuit of meta-meta diazo dyes. This is suspected to be a result of a person of ordinary skill in the art believing that meta-meta diazo dyes having similar substitutions as the ortho-ortho diazo dyes of the '708 Patent would have similar mutagenicity, lower color value, or both.

Producing dyes and compositions which present lower carcinogenic risks is a desirable goal which can lower health risks for dye manufacturers and consumers. Unlike the mutagenic Solvent Red 164 currently known, the molecule and/or dye component and/or composition presently disclosed yields a negative Ames test indicating that the dyes are non-mutagenic, while having comparable properties (color strength, shade, stability, etc) to the mutagenic Solvent Red 164. The starting materials, intermediates, and degradation products of the present invention, also present reduced mutagenic risks.

SUMMARY OF THE INVENTION

The present disclosure provides a molecule and/or dye and/or dye composition that overcomes the aforementioned drawbacks. The molecule and/or dye and/or dye composition provide lower mutagenic characteristics that are useful in coloring and/or marking hydrocarbon compositions, while increasing purity and thermal and cold storage stability. The dyes and/or compounds disclosed provide enhanced surprising and unexpected properties. The dye compositions disclosed herein provide a safer alternative to known dye compositions.

In an aspect, the present disclosure provides a composition and/or a dye component and/or compound comprising the formula:

(I)

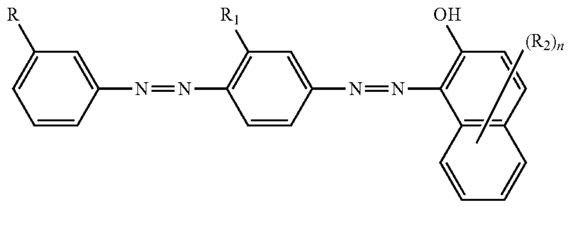

wherein R is a methyl group, an ethyl group, or an isopropyl group, and $R_1$ is a methyl group, an ethyl group, or an isopropyl group, $R_2$ is an alkyl group containing from 3 to 12 carbon atoms and n is an integer from 1 to 3.

In another aspect, the present disclosure provides a composition for marking a hydrocarbon composition. The composition can include the compound of Formula (I) and a solvent. The compound can be present in an amount by weight of between 0.1% and 70%. The solvent can be present in an amount by weight of between 30% and 99.9%.

In yet another aspect, the present disclosure provides a marked hydrocarbon composition. The marked hydrocarbon composition can include a hydrocarbon fluid and the compound of Formula (I). The compound of Formula (I) can be present in an amount of between 0.1 ppm and 500 ppm.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

Not Applicable.

DETAILED DESCRIPTION OF THE INVENTION

Before the present invention is described in further detail, it is to be understood that the invention is not limited to the particular embodiments described. It is also to be understood that the terminology used herein is for the purpose of describing particular embodiments only, and is not intended to be limiting. The scope of the present invention will be limited only by the claims. As used herein, the singular forms "a", "an", and "the" include plural embodiments unless the context clearly dictates otherwise.

It should be apparent to those skilled in the art that many additional modifications beside those already described are possible without departing from the inventive concepts. In interpreting this disclosure, all terms should be interpreted in the broadest possible manner consistent with the context. Variations of the term "comprising", "including", or "having" should be interpreted as referring to elements, components, or steps in a non-exclusive manner, so the referenced elements, components, or steps may be combined with other elements, components, or steps that are not expressly referenced. Embodiments referenced as "comprising", "including", or "having" certain elements are also contemplated as "consisting essentially of" and "consisting of" those elements, unless the context clearly dictates otherwise. It should be appreciated that aspects of the disclosure that are described with respect to a system are applicable to the methods, and vice versa, unless the context explicitly dictates otherwise.

Numeric ranges disclosed herein are inclusive of their endpoints. For example, a numeric range of between 1 and 10 includes the values 1 and 10. When a series of numeric ranges are disclosed for a given value, the present disclosure expressly contemplates ranges including all combinations of the upper and lower bounds of those ranges. For example, a numeric range of between 1 and 10 or between 2 and 9 is intended to include the numeric ranges of between 1 and 9 and between 2 and 10.

As used herein, "alkyl group" refers to an alkane lacking a single hydrogen and includes straight chain and branched alkyl groups. For clarity, as used herein, a propyl group includes isopropyl groups, unless the context clearly dictates otherwise, and the same is true for other alkyl groups.

In an aspect, the present disclosure provides a composition and/or a dye component and/or a compound having the formula:

(I)

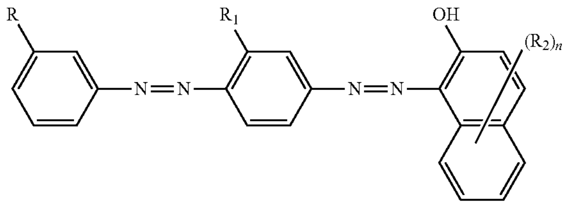

wherein R is a methyl group, an ethyl group, or an isopropyl group, $R_1$ is a methyl group, an ethyl group, or an isopropyl group, $R_2$ is an alkyl group containing from 3 to 12 carbon atoms, n is an integer from 1 to 3.

In certain aspects, R is a methyl group and $R_1$ is a methyl group.

In certain aspects, R is an ethyl group or an isopropyl group and $R_1$ is an ethyl group or an isopropyl group.

In certain aspects, $R_2$ is a heptyl group, an octyl group, or a nonyl group.

In one aspect, the present disclosure provides a compound of Formula (I), wherein R is methyl, $R_1$ is methyl, $R_2$ is heptyl, octyl, or nonyl, and n is an integer from 1 to 3. In one aspect, R is methyl, $R_1$ is methyl, $R_2$ is heptyl, and n is 1. In one aspect, R is methyl, $R_1$ is methyl, $R_2$ is octyl, and n is 1. In one aspect, R is methyl, $R_1$ is methyl, $R_2$ is nonyl, and n is 1. It should be appreciated that the non-mutagenicity of this aspect is particularly surprising, given that a methyl-methyl substituted ortho-ortho dye from the '708 Patent exhibited a strong mutagenic response.

In another aspect, the present disclosure provides a compound of Formula (I) wherein R is ethyl or isopropyl, $R_1$ is ethyl or isopropyl, $R_2$ is heptyl, octyl, or nonyl, and n is an integer from 1 to 3.

Dyes presently disclosed are formulated to provide a peak absorbance at 520 to 540 nm of at least 0.5 absorbance units, at least 0.55 absorbance units, at least 0.6 absorbance units, or about 0.608 absorbance units when measured at a concentration of 40 mg/L in xylene for a pathlength of 1 cm. Absorbance units are measured by the following equation: $A=\log_{10}I_i/I_t$, where A is the absorbance, $I_i$, is the intensity of the illuminating beam, and $I_t$ is the intensity of the transmitted beam.

With regard to purity, xylene insoluble levels are equivalent or, in some embodiments, better than known compounds.

The dyes of this disclosure can be made in either liquid or solid (tar or dry powder) forms. Due to the desire of commercial users for convenient and easy handling, concentrated liquids are usually preferred, particularly in the United States. When a liquid concentrate is used, the dye component will typically comprise about 30-70% of the liquid concentrate. Other degrees of dilution, however, may be used, as discussed below. The remainder of a liquid concentration of the dye will be solvents such as alkyl benzenes, Xylenes, alkyl naphthalenes or other hydrocarbons, esters, ketones, long chain fatty acids etc., appropriate to the final intended use, including those discussed below.

The dyes of the present invention can be made by any of the several synthetic techniques familiar to those of ordinary skill in the art. Typically, to form a petroleum soluble liquid concentrate containing applicants' dye, three main steps are involved: 1) preparation of a "red base" by coupling aromatic amines to give an amino-azo compound; 2) preparing an alkyl beta-naphthol; and 3); coupling the diazotized red base with the alkyl beta naphthol to form the red azo dye. Methods of making dyes of the present invention are contained in U.S. Pat. Nos. 3,690,809 and 3,704,106 the disclosures of which are incorporated herein by reference in their entirety. Many different processes may be used, however, depending on capabilities of available manufacturing facilities.

In the formation of red base useful to make compounds of Formula I, the diazotization of 3,3'-dimethyl-, 3,3'-diethyl-, 3,3'-di-(1-methylethyl)-, 3-methyl-3'-ethyl-3-methyl-3'-(1-methylethyl)-, 3-ethyl-3'-methyl-, 3-ethyl-3'-(1-methylethyl)-, 3-(1-methylethyl)-3'-methyl-, or 3-(1-methylethyl)-3'-ethyl-aminoazobenzene, or combinations thereof, is involved followed by their azo coupling with alkyl substituted 2-naphthalenol. The aminoazobenzene derivatives may be synthesized, for instance, by the methods disclosed U.S. Pat. No. 2,538,431, or FIAT Report 1313 Volume II, page 376, the disclosures of which are incorporated herein by reference in their entirety. Other aspects of preparing a red base are disclosed in Zollinger, "Color Chemistry" (1987); U.S. Pat. No. 4,000,985; Groggins, "Unit Processes In Organic Synthesis," (1938); and U.S. Pat. No. 3,793,305, the disclosures of which are incorporated herein by reference in their entirety.

The alkylnaphthalenols may be synthesized by the classic Friedel-Crafts alkylation reaction for instance in accordance with those methods suggested in U.S. Pat. No. 2,090,938, and British Patent 688,000, and U.S. application Ser. No. 468,551 (filed Jun. 6, 1965) the disclosures of which is also incorporated herein by reference in their entirety. In general, a crude alkyl beta-naphthol intermediary may be prepared by alkylating beta-naphthol with alkenes in the presence of a catalyst such as zinc chloride, boron trifluoride, or an appropriate ion exchange resin, optionally together with an acid such as hydrochloric acid or hydrobromic acid. Alkenes, used to alkylate the naphthol moeity include propene, heptene, octene and nonene which are commercially available and usually consist of a mixture of isomers. Alternatively, the alkylnaphthol may be prepared by the condensation of an alcohol with the naphthol in the presence of a Friedel-Crafts catalyst.

The red base and alkyl beta naphthol are coupled together by techniques that are mentioned or disclosed in the above-identified references. They may be coupled in the presence of base or in the presence of acid (sometimes referred to as reverse coupling). Reverse coupling is illustrated, for instance, in U.S. Pat. Nos. 921,546, 1,947,029 and 2,016,495, the disclosures of which are incorporated herein by reference in their entirety. In general, if a liquid, petroleum-soluble dye composition is desired, the coupling may be carried out in the presence of the desired solvent, such as xylene.

In the method of this disclosure, the composition of the alkylated 2-naphthalenol, and alkyl derivatives thereof, contains no more than about 15% by weight and preferably less than about 10% free unalkylated 2-naphthalenol. This produces a dye wherein at least one of the hydrogen atoms in the naphthalene nucleus is substituted by an alkyl group. This is important since the unalkylated 2-naphthalenol and derived homologues are weakly mutagenic. Reducing the presence of this homologue as much as possible, however, is desirable to further reduce mutagenic risk attributable to the dye.

The mutagenic characteristics of chemicals, including the red dyes discussed above, are evaluated using a current conventional and recognized test known as the "Ames Test". The test is generally described in L. J. Watkins, et al. "Molecular Biology of the Gene," 4th Ed., Vol. I, (1987) p. 355-357; and Ames, B. 1979 "Identifying Environmental Chemicals Causing Mutations and Cancer." Science 204: 587-593, the disclosures of which are incorporated herein by reference in their entirety. A positive Ames Test result indicates that a compound is mutagenic. A positive Ames Test therefor also indicates that the tested compound possibly possesses carcinogenic activity. Thus, the carcinogenic potential of a compound may be predicted based upon the Ames Test results.

In general, the Ames Test is a *S. typhimurium* reversion assay. Select histidine auxotrphs of *S. typhimurium* have been selected which are normally growth-arrested due to mutations in a gene needed to produce an essential amino acid:histidine. In the absence of an external histidine source, the cells cannot grow to form colonies unless a reversion of the mutation occurs which allows the production of histidine to be resumed. As might be expected spontaneous reversion occurs with each of the strains, usually at a low level (with the exception of a strain known as TA 100). However, chemical agents can induce a mutagenic response so that the number of revertant colonies is substantially higher than the spontaneous background reversion level. The test involves analysis of the number of revertent colonies obtained with each strain in the presence and absence of the test chemical. Since the mutagenic response of a formulation could vary with the concentration, test materials are routinely dosed over an appropriate concentration range. In a standardized protocol, a complete matrix of positive and negative controls are included with the assay, and are plated in duplicate with all of the test strains. Aroclor™ 1254 induced rat liver microsomes are included to mimic the in vivo activity of the liver enzymes in activating some pro-mutagens to mutagenic status. The protocols for performing an Ames Test are well established and are performed by a number of testing organizations such as Eurofins BioPharma Product Testing Munich, GmbH, in Munich, Germany.

The criteria for determining whether a sample is mutagenic is generally as follows: 1. For a negative Ames Test (not mutagenic), total revertants in any strain at any concentration should not be at or greater than three times background, with or without metabolic activation. 2. For a positive Ames test (mutagenic), two or more consecutive points must be at or greater than two times background in the same strain either with or without metabolic activation. A clear indication of mutagenicity is obtained when the sample exceeds three times background at any concentration. 3. When the background is running low (e.g. 6 colonies or less) and a good response is obtained with the positive control, then the number of revertants should exceed twenty colonies/plate for the sample to be scored as mutagenic.

The present disclosure also provides compositions for marking hydrocarbon fluids. The composition for marking hydrocarbon fluids can include the compound having formula (I), including any and all aspects described above with any and all substitutions disclosed above, and a solvent. The compound can be present in an amount by weight of between 0.1% and 70%. The solvent can be present in an amount by weight of between 30% and 99.9%.

In addition to the compound and the solvent, the composition can contain various additives without departing from the present disclosure. The additives can be present in an amount by weight of less than 10%, less than 5% or less than 1%. Examples of additives include, but are not limited to, a variety of glycol ethers sold under the trade mark "Dowanols", alcohols such as benzyl alcohol, lubricity improvers, corrosion inhibitors, static dissipator additives, and the like.

Suitable solvents can include, but are not limited to, aromatic solvents, aprotic solvents, and the like. Suitable aromatic solvents include, but are not limited to, alkyl benzenes, such as toluene or xylene, and alkyl naphthalenes; other hydrocarbon oils such as the naphthenic oils, mineral oils, and the like; aromatic alcohols, such as benzyl alcohol and phenol glycol ether; and the like. Suitable aprotic solvents include, but are not limited to, formamide, N,N-dimethylformamide, N,N-dimethyl acetamide, 1-alkyl-2-pyrrolidone, and the like. Other suitable solvents can include ketones such as acetone and ethylmethyl ketone, esters such as ethyl acetate and esters of long chain fatty acids such as methyl soyate, corn oil ester, and the like. In addition, the hydrocarbon fluids themselves, listed below, can serve as a solvent.

The present disclosure also provides marked hydrocarbon compositions. The marked hydrocarbon compositions can include a hydrocarbon fluid and the compound of Formula (I), including any and all aspects described above with any and all substitutions disclosed above.

The hydrocarbon fluid can be a fuel, such as diesel fuel, gasoline, gasohol, kerosene, or the like; a crude oil derivative; a food oil, such as vegetable oil, olive oil, or the like; a wax composition; or other hydrocarbon fluid known to those having ordinary skill in the art to which marking with the dyes disclosed herein might be desirable.

In some cases, the marked hydrocarbon fluid can include the compound having formula (I) in a concentration of between 0.01 ppm and 500 ppm.

It is envisioned that dye compositions may comprise mixtures of the presently disclosed compounds. In some embodiments, mixtures of the dyes may allow users to adjust the shade of the dye compositions. It is envisioned that the presently disclosed dyes may also be mixed with other colorants, such as, but not limited to, yellow and blue dyes. It is also envisioned that the presently disclosed hydrocarbons may be, but are not limited to, petroleum products, including but not limited to, waxes.

Example 1

45.0 grams of 3,3'-dimethylamino-azobenzene is slurried with 400 grams of water at 30° C. 52.0 grams of hydrochloric acid, 37% is then added drop wise into the well stirred slurry of the azobenzene. The reaction mixture is stirred for 30 minutes and then cooled to 10° C. A solution of 15.0 grams of sodium nitrite dissolved in 30.0 grams of water is now added drop wise while maintaining the temperature of the reaction mixture between 10 and 15° C. by addition of ice, as needed. After a short period of stirring a deep brown solution of the corresponding diazonium chloride is obtained. Excess nitrite is then removed by the addition of sulfamic acid.

In a separate flask, 0.21 moles of X-heptyl-2-naphthol is dissolved in 175.0 grams of toluene and 30 grams of sodium carbonate is added. The diazonium chloride is now slowly added to a well stirred mixture of the 2-naphthol. Azo coupling is rapid and results in the formation of a red dye solution. The reaction mixture is then heated to 60° C. and transferred to a separatory funnel where the phases are allowed to separate. The lower aqueous phase is discarded while the toluene solution of the dye is transferred to an Erlenmeyer flask. It is allowed to dry over anhydrous sodium sulfate and then filtered into a distillation flask. The flask is gradually heated to 120° C. under reduced pressure to remove all materials volatile under these conditions. A sample of this dye when subjected to "Ames Test" yielded a negative result indicating that the dye is non-mutagenic.

The dye produced by Example 1 is formulated to provide an absorbance of approximately 0.608 absorbance units at 521±3 nm when measured at a concentration of 40 mg/l in xylene across a 1 cm pathlength. With regard to purity, Xylene insoluble levels are equivalent or, in some embodiments, better than known compounds.

Prophetic Example 2

The process of Example 1 will be repeated, substituting X-octyl-2-naphthol for the X-heptyl-2-naphthol. The resulting dye is expected to have similar properties and is expected to yield a negative result on the Ames Test, indicating that the dye is non-mutagenic.

Prophetic Example 3

The process of Example 1 will be repeated, substituting X-nonyl-2-naphthol for the X-heptyl-2-naphthol. The resulting dye is expected to have similar properties and is expected to yield a negative result on the Ames Test, indicating that the dye is non-mutagenic.

The present invention has been described in terms of one or more preferred embodiments, and it should be appreciated that many equivalents, alternatives, variations, and modifications, aside from those expressly stated, are possible and within the scope of the invention.

The invention claimed is:

1. A composition for marking a hydrocarbon fluid, the composition comprising:

between 0.1% and 70% by weight of a compound having the formula:

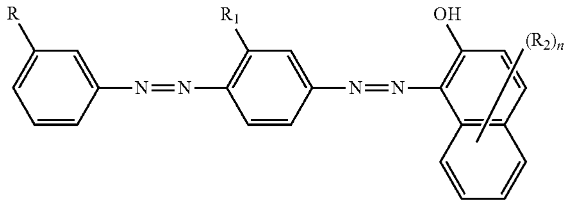

wherein R is a methyl group, $R_1$ is a methyl group, and $R_2$ is an alkyl group containing from 3 to 12 carbon atoms and n is an integer from 1 to 3, wherein the compound produces a negative Ames Test result; and between 30% and 99.9% by weight of a solvent.

2. The composition according to claim 1, wherein $R_2$ is an alkyl group containing from 7 to 9 carbon atoms.

3. The composition according to claim 1, wherein n is 1.

4. The composition according to claim 1, wherein $R_2$ is a heptyl group, an octyl group, or a nonyl group.

5. The composition according to claim 4, wherein n is 1.

6. The composition according to claim 4, wherein $R_2$ is a heptyl group.

7. The composition according to claim 6, wherein n is 1.

8. A marked hydrocarbon composition comprising:

a hydrocarbon fluid; and from 0.1 ppm to 500 ppm of a compound having the formula:

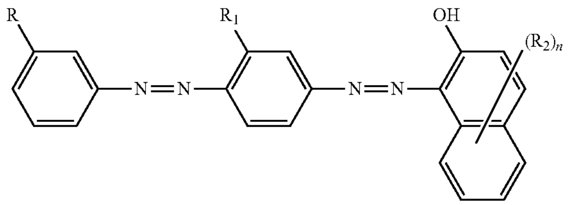

wherein R and $R_1$ is a methyl group, and $R_2$ is an alkyl group containing from 3 to 12 carbon atoms and n is an integer from 1 to 3, wherein the compound produces a negative Ames Test result.

9. The composition according to claim 8, wherein $R_2$ is an alkyl group containing from 7 to 9 carbon atoms.

10. The composition according to claim 8, wherein n is 1.

11. The composition according to claim 8, wherein $R_2$ is a heptyl group, an octyl group, or a nonyl group.

12. The composition according to claim 11, wherein n is 1.

13. The composition according to claim 11, wherein $R_2$ is a heptyl group.

14. The composition according to claim 13, wherein n is 1.

* * * * *